(12) United States Patent
Jo et al.

(10) Patent No.: US 11,844,264 B2
(45) Date of Patent: Dec. 12, 2023

(54) DISPLAY PANEL AND METHOD OF MANUFACTURING THE SAME

(71) Applicant: SAMSUNG DISPLAY CO., LTD., Yongin-si (KR)

(72) Inventors: Wonje Jo, Yongin-si (KR); Youngji Kim, Yongin-si (KR); Yiseul Um, Yongin-si (KR); Younghoon Lee, Yongin-si (KR); Jiwon Jung, Yongin-si (KR); Youngseo Choi, Yongin-si (KR); Dongwon Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/938,061

(22) Filed: Oct. 5, 2022

(65) Prior Publication Data

US 2023/0024760 A1    Jan. 26, 2023

Related U.S. Application Data

(62) Division of application No. 16/737,000, filed on Jan. 8, 2020, now Pat. No. 11,495,771.

(30) Foreign Application Priority Data

Mar. 12, 2019  (KR) .................. 10-2019-0028259

(51) Int. Cl.
*H10K 71/00* (2023.01)
*H10K 59/12* (2023.01)
(Continued)

(52) U.S. Cl.
CPC ......... *H10K 71/851* (2023.02); *H10K 50/844* (2023.02); *H10K 50/8426* (2023.02);
(Continued)

(58) Field of Classification Search
CPC .............. H10K 71/851; H10K 59/1201; H01L 27/1262
See application file for complete search history.

(56) References Cited

U.S. PATENT DOCUMENTS 8,721,389 B2    5/2014  Jung et al.
8,721,392 B2    5/2014  Brown et al.
(Continued)

FOREIGN PATENT DOCUMENTS

JP          2018-170498    11/2018
KR          10-0812002      3/2008
(Continued)

*Primary Examiner* — Peter M Albrecht
(74) *Attorney, Agent, or Firm* — F. CHAU & ASSOCIATES, LLC

(57) ABSTRACT

Systems and methods are described for a display panel and a method of manufacturing the display panel. The systems and methods may provide for a substrate having a first surface and a second surface that face each other, a display unit including an organic light-emitting device arranged on the first surface of the substrate; and a thin-film encapsulation layer arranged on the display unit to shield the display unit, wherein an edge of the first surface or an edge of the second surface are inclined with respect to the first surface or the second surface. The inclined surfaces are designed to prevent damage to the display due to fine cracks during the manufacturing process as the display panel is trimmed or cut from a single base member. A display panel having improved strength characteristics may be manufactured, as well.

15 Claims, 8 Drawing Sheets

(51) Int. Cl.
  *H10K 50/842* (2023.01)
  *H10K 50/844* (2023.01)
(52) U.S. Cl.
  CPC ......... *H10K 59/1201* (2023.02); *H10K 71/00* (2023.02); *H10K 59/12* (2023.02)

(56) References Cited

U.S. PATENT DOCUMENTS

| | | |
|---|---|---|
| 8,854,591 B2 | 10/2014 | Liu et al. |
| 9,474,125 B2 | 10/2016 | Kim et al. |
| 9,720,268 B2 | 8/2017 | Liu et al. |
| 10,043,860 B2 | 8/2018 | Kang et al. |
| 2007/0182314 A1 | 8/2007 | Oh et al. |
| 2007/0241674 A1 | 10/2007 | Chao et al. |
| 2008/0055831 A1 | 3/2008 | Satoh |
| 2013/0059500 A1 | 3/2013 | Mase |
| 2013/0194761 A1 | 8/2013 | Kim |
| 2014/0159078 A1 | 6/2014 | Kim |
| 2017/0084879 A1* | 3/2017 | Wen ........................ H10K 71/00 |
| 2018/0190631 A1 | 7/2018 | Kim et al. |
| 2020/0184856 A1 | 6/2020 | Wang et al. |
| 2020/0295297 A1 | 9/2020 | Jo et al. |
| 2021/0201818 A1 | 7/2021 | Jang et al. |
| 2021/0343758 A1 | 11/2021 | Zhang et al. |

FOREIGN PATENT DOCUMENTS

| | | |
|---|---|---|
| KR | 10-0832296 | 5/2008 |
| KR | 10-2018-0043896 | 5/2018 |

\* cited by examiner

DISPLAY PANEL AND METHOD OF MANUFACTURING THE SAME

CROSS-REFERENCE TO RELATED PATENT APPLICATION

This application is a division of U.S. patent application Ser. No. 16/737,000 filed on Jan. 8, 2020, which claims priority under 35 U.S.C § 119 to and the benefit of Korean Patent Application No. 10-2019-0028259, filed on Mar. 12, 2019, in the Korean Intellectual Property Office, the disclosure of which are hereby incorporated by reference in their entirety.

BACKGROUND

1. Field

One or more embodiments relate to apparatuses and methods, and more particularly, to a display panel and a method of manufacturing the display panel.

2. Description of the Related Art

Mobile electronic devices have become widely used around the world, with tablet computers and mobile phones owning a large share of daily usage. These mobile electronic devices support various functions such as phone calls, e-mail, navigation, music, or games, but are not limited as such.

To support these functions, the mobile electronic devices include a display panel to provide a user with visual information such as images or videos. Recently, as components for driving such display panels have become progressively smaller, the occupancy of the display panels in electronic devices is gradually increasing. Moreover, a structure that has been designed to be a curve (i.e. to have a predetermined angle from a flat state) has been developed. This type of design provides new manufacturing challenges that should be addressed.

In general, when a display panel is manufactured, a plurality of display panels can be formed on a single base member. The base member is then cut into a plurality of portions. At this time, fine cracks can be generated in the cut portions of the base member, and the generated fine cracks may reduce the rigidity of a manufactured display panel.

SUMMARY

One or more embodiments include a display panel having increased rigidity after being manufactured, and a method of manufacturing the display panel.

Additional aspects will be set forth in part in the description which follows and, in part, will be apparent from the description or may be learned by practice of the presented embodiments.

According to one or more embodiments, a display panel includes a substrate having a first surface and a second surface that face each other; a display unit including an organic light-emitting device arranged on the first surface of the substrate; and a thin-film encapsulation layer arranged on the display unit to shield the display unit, wherein an edge of the first surface or an edge of the second surface are inclined with respect to the first surface or the second surface.

A distance from a starting point of the inclined edge of the first surface or the inclined edge of the second surface to a face of the substrate may be 5 µm or greater.

The display panel may further include a protection unit arranged on the thin-film encapsulation layer to shield the thin-film encapsulation layer.

The substrate may include a first area shielded by the protection unit, and a second area not overlapping the first area and having, arranged on the second area, at least one of an adhesive, cerium dioxide ($CeO_2$), diamond, silicon carbide (SiC), and an ionic component of a surfactant.

The protection unit may include an adhesive arranged on the thin-film encapsulation layer; and a protection film arranged on the adhesive.

According to one or more embodiments, a method of manufacturing a display panel includes manufacturing a display panel including a substrate having a first surface and a second surface, a display unit arranged on the first surface of the substrate and including an organic light-emitting diode, and a thin-film encapsulation layer configured to shield the display unit; removing a portion of the substrate on which the thin-film encapsulation layer is not arranged; and forming a slanting surface inclined with respect to the first surface or the second surface by grinding an edge of the first surface or an edge of the second surface from which the portion of the substrate has been removed.

The method may further include arranging a protection unit on the thin-film encapsulation layer.

The method may further include removing a portion of the protection unit.

The protection unit may include an adhesive arranged on the thin-film encapsulation layer; and a protection film arranged on the adhesive.

The edge of the first surface or the edge of the second surface may be ground using a soft pad or a hard pad.

A distance from a starting point of the inclined corner of the first surface or the inclined corner of the second surface to an end of the substrate may be 5 µm or greater.

According to one or more embodiments, a method of manufacturing a display panel includes manufacturing a display panel including a substrate having a first surface and a second surface, a display unit arranged on the first surface of the substrate and including an organic light-emitting diode, and a thin-film encapsulation layer configured to shield the display unit; arranging a protection unit on the thin-film encapsulation layer; removing a portion of the protection unit on which the thin-film encapsulation layer is not arranged; dividing the substrate into a first area where the protection unit shields the first substrate and a second area that does not overlap the first area, by removing a portion of the substrate from which the portion of the protection unit has been removed; and forming a slanting surface inclined with respect to the first surface or the second surface by grinding an edge of the first surface or an edge of the second surface from which the portion of the substrate has been removed.

The method may further include removing foreign materials on the second area.

The foreign materials on the second area may be cleaned and removed by using a surfactant.

The foreign materials on the second area may be processed with oxygen plasma and removed.

At least one of an adhesive, cerium dioxide ($CeO_2$), diamond, silicon carbide (SiC), and an ionic component of a surfactant may be arranged on the second area.

A distance from a starting point of the inclined corner of the first surface or the inclined corner of the second surface to an end of the substrate may be 5 μm or greater.

The protection unit may include the adhesive arranged on the thin-film encapsulation layer; and a protection film arranged on the adhesive.

The adhesive may include polyurethane.

The edge of the first surface or the edge of the second surface may be ground using a soft pad or a hard pad.

These and other aspects will become apparent and more readily appreciated from the following description of the embodiments, taken in conjunction with the accompanying drawings.

These general and specific embodiments may be implemented by using a system, a method, a computer program, or a combination thereof.

BRIEF DESCRIPTION OF THE DRAWINGS

These and other aspects will become apparent and more readily appreciated from the following description of the embodiments, taken in conjunction with the accompanying drawings in which.

DETAILED DESCRIPTION

Figure 1:
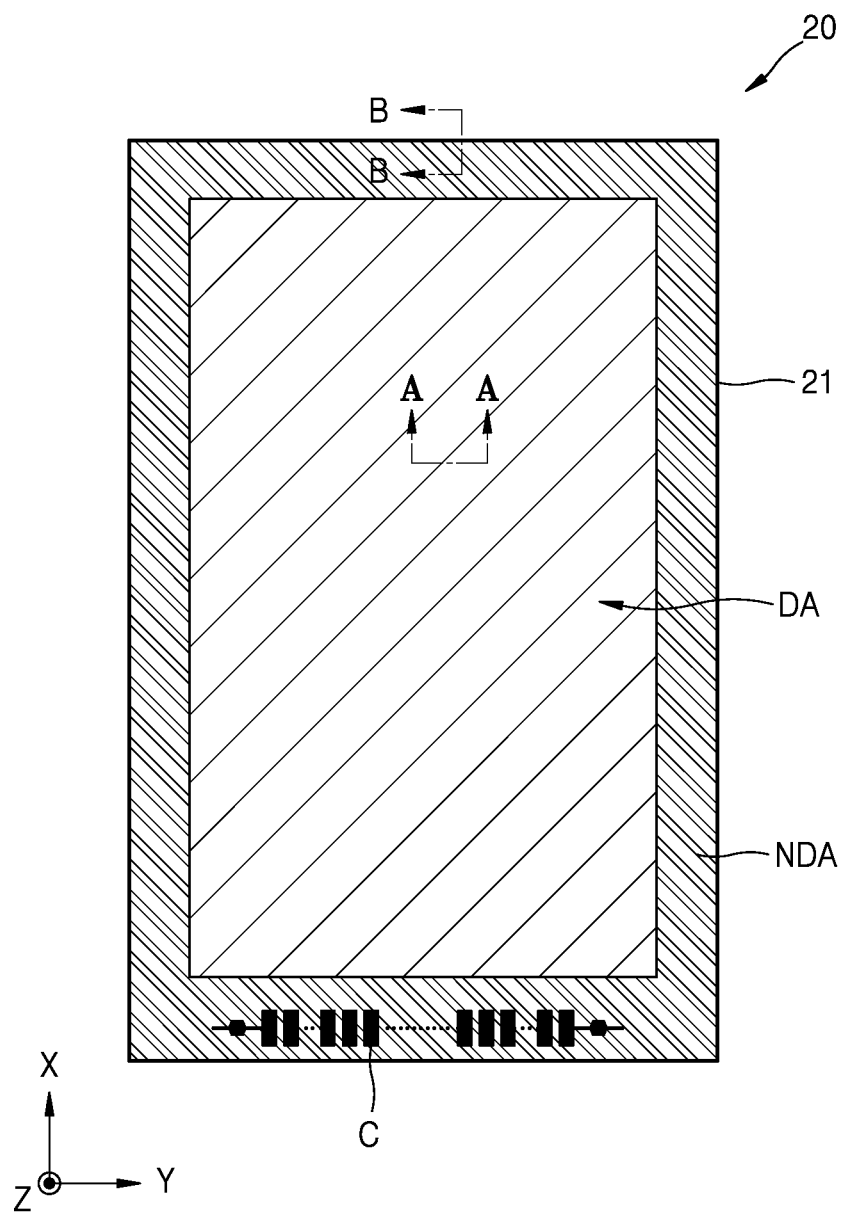
FIG. 1 is a plan view of a portion of a display panel according to an embodiment.

Manufacturing methods and processes used to create a display device typically use a single substrate that is cut into multiple pieces. In some cases, small cracks develop on the edges of the display where the substrate has been cut. This can compromise the strength or integrity of the display device. For example, fine cracks can expand and become larger cracks.

Thus, the present disclosure provides systems and methods that prevent damage due to fine cracks developed during the manufacturing process. For example, one or more surfaces of the substrate may be provided with chamfered edges. A chamfered edge can mitigate stresses on the edges of the surface and prevent the formation or growth of fine cracks or other damage. Embodiments of the present disclosure provide a process for creating a slanted edge, inclined with respect to the surfaces, by grinding off, or removing, a portion of the edge of the substrate.

As the disclosure allows for various changes and numerous embodiments, particular embodiments will be illustrated in the drawings and described in detail in the written description. Hereinafter, effects and features of the present disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence and rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. Since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system and may be interpreted in a broader sense. For example, the x-axis, the y-axis, and the z-axis may be perpendicular to one another, or may represent different directions that are not be perpendicular to one another.

When a certain embodiment may be implemented differently, a specific process order may be performed differently from the described order. For example, two consecutively described processes may be performed substantially at the same time or performed in an order opposite to the described order.

Figure 2:
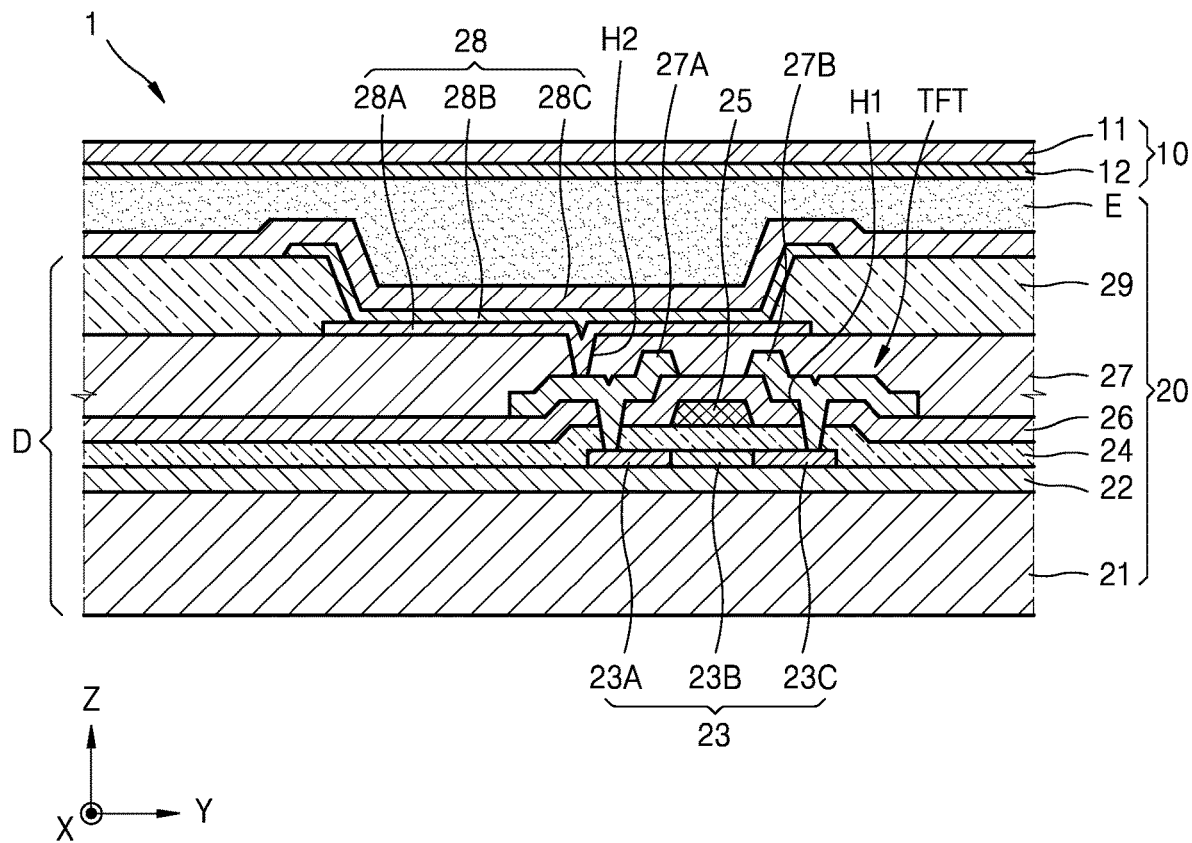
FIG. 2 is a cross-sectional view taken along line A-A of FIG. 1.
Figure 3:
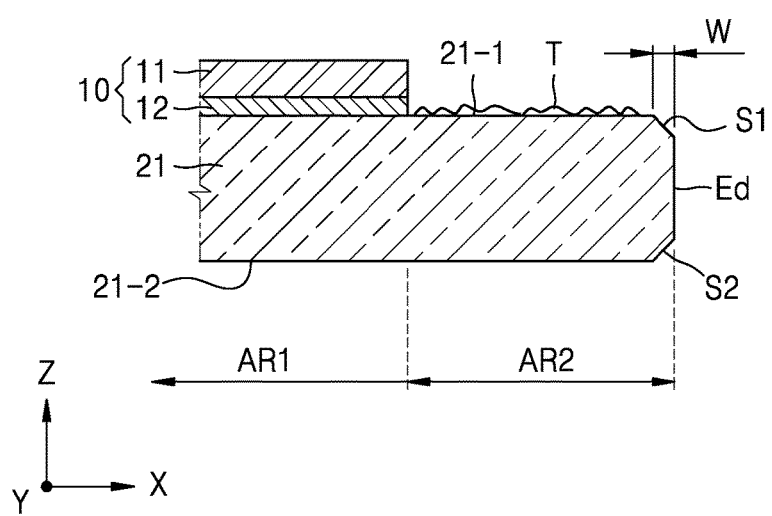
FIG. 3 is a cross-sectional view taken along line B-B of FIG. 1.
Figure 4:
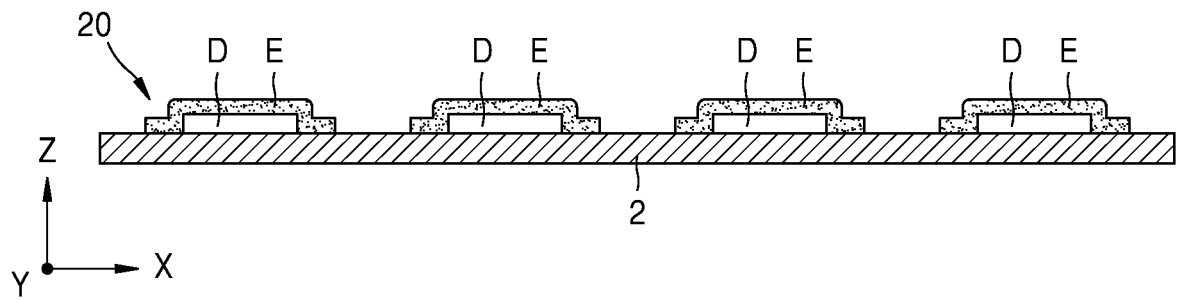
FIGS. 4 through 10 are cross-sectional views of a method of manufacturing a display panel, according to an embodiment.
Figure 5:
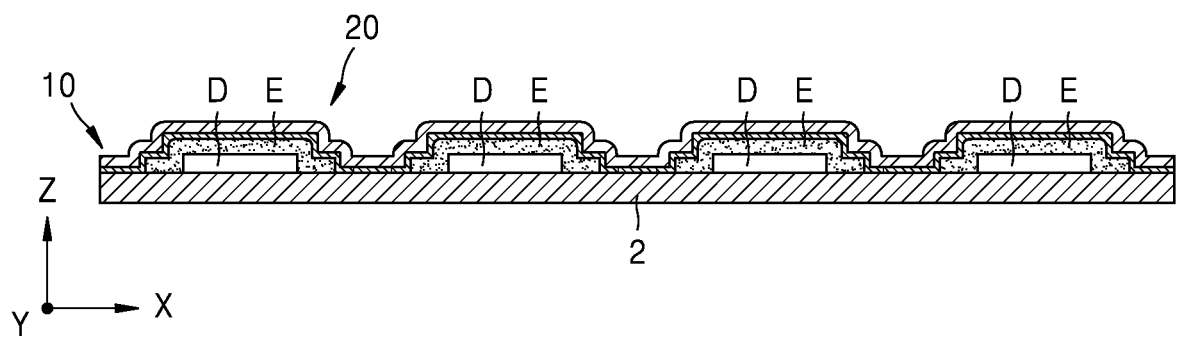
Figure 6:
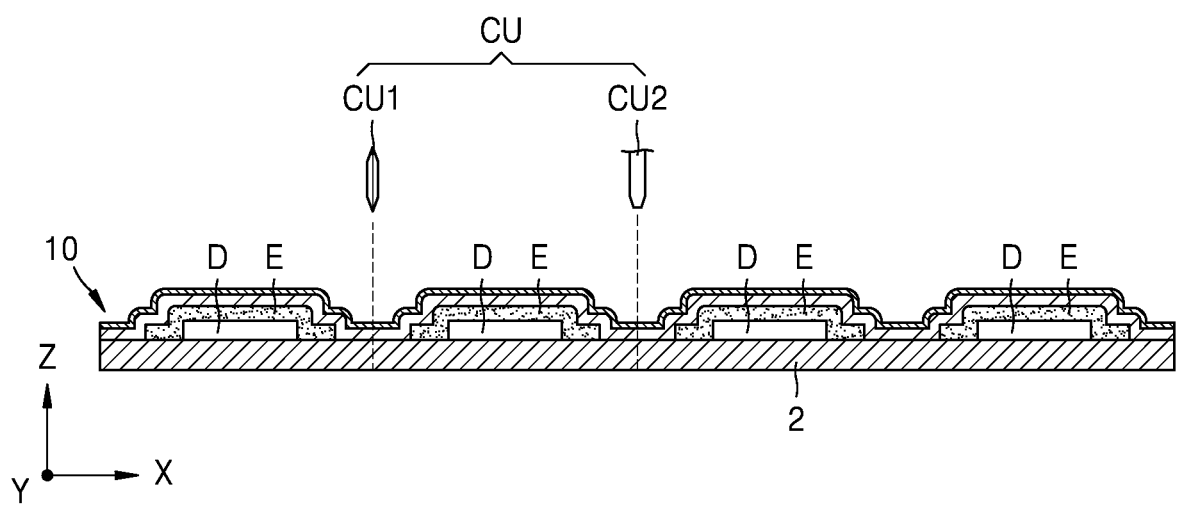
Figure 7:
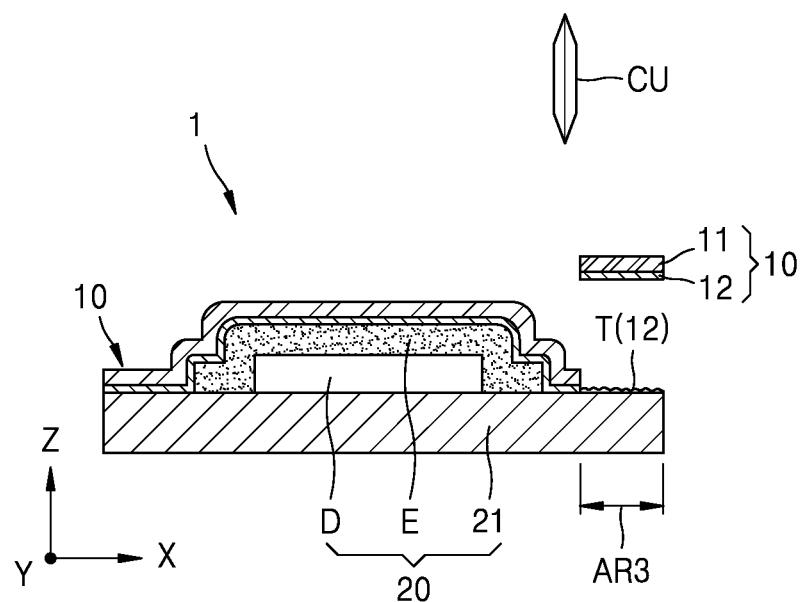

FIG. 1 is a plan view of a portion of a display panel 1 according to an embodiment. FIG. 2 is a cross-sectional view taken along line A-A of FIG. 1. FIG. 3 is a cross-sectional view taken along line B-B of FIG. 1.

Referring to FIGS. 1 through 3, the display panel 1 may include a panel unit 20 and a protection unit 10. In the panel unit 20, a display area DA and a non-display area NDA around the display area DA may be defined on a substrate 21. A display unit D may be arranged in the display area DA, and power wiring (not shown), for example, may be arranged in the non-display area NDA. A pad unit C may be arranged in the non-display area NDA.

The panel unit 20 may include the substrate 21, the display unit D, and a thin-film encapsulation layer E. The display unit D may include a thin film transistor (TFT), a passivation layer 27, and an organic light-emitting diode (OLED) 28.

The substrate 21 may include glass or a plastic material, or may include a metal material, such as, steel use stainless (SUS) or titanium (Ti). In one embodiment, the substrate 21 is formed of glass, but the disclosure is not limited thereto.

The substrate 21 may include a first surface 21-1 and a second surface 21-2. The display unit D may be arranged on the first surface 21-1 or the second surface 21-2. For convenience of description, a case where the display unit D is arranged on the first surface 21-1 will now be described in detail.

At least one of the edges of the first surface 21-1 or at least one of the edges of the second surface 21-2 may be tapered, beveled, or chamfered. In one example, the taper or chamfer may have an approximately 45 degree angle with respect to either the surface or edge. In another embodiment, the angle is between 30 and 60 degrees from the surface of the substrate 21.

In other embodiments, the taper or chamfer may include multiple angles, or may include a rounded edge. Thus, by incorporating a tapered or chamfered edge, the substrate 21 may have improved strength or integrity compared to a substrate 21 without a tapered or chamfered edge. Thus, the substrate 21 may be less likely to develop cracks or other damage during or after the manufacturing process. As used herein, the term slanting surface may refer to a taper, a chamfer, multiple chamfers, or a rounded surface. In the embodiment illustrated in FIG. 3, slanting surfaces S1 and S2 form chamfered edges on substrate 21.

For example, according to an embodiment, a first slanting surface S1 may be arranged on a shorter edge from among the edges of the first surface 21-1, or a second slanting surface S2 may be arranged on a shorter edge from among the edges of the second surface 21-2. According to another embodiment, the first slanting surface S1 may be arranged on a shorter edge from among the edges of the first surface 21-1, and the second slanting surface S2 may be arranged on a shorter edge from among the edges of the second surface 21-2.

According to another embodiment, the first slanting surface S1 may be arranged on a longer edge from among the edges of the first surface 21-1, or the second slanting surface S2 may be arranged on a longer edge from among the edges of the second surface 21-2. According to another embodiment, the first slanting surface S1 may be arranged on a longer edge from among the edges of the first surface 21-1, or the second slanting surface S2 may be arranged on a longer edge from among the edges of the second surface 21-2.

According to another embodiment, the first slanting surface S1 may be arranged on a shorter edge from among the edges of the first surface 21-1, and the second slanting surface S2 may be arranged on a longer edge from among the edges of the second surface 21-2. According to another embodiment, the first slanting surface S1 may be arranged on a longer edge from among the edges of the first surface 21-1, and the second slanting surface S2 may be arranged on a shorter edge from among the edges of the second surface 21-2.

According to another embodiment, the first slanting surface S1 may be arranged on a longer edge from among the edges of the first surface 21-1, and the second slanting surface S2 may be arranged on a longer edge from among the edges of the second surface 21-2. For convenience of explanation, a case where the first slanting surface S1 is arranged on a shorter edge from among the edges of the first surface 21-1 and the second slanting surface S2 is arranged on a shorter edge from among the edges of the second surface 21-2 will now be described in detail.

The first and second slanting surfaces S1 and S2 may be arranged on both edges of a shorter side surface Ed from among shorter side surfaces of the substrate 21. According to another embodiment, the first and second slanting surfaces S1 and S2 may be arranged on the edges of different shorter side surfaces from among the shorter side surfaces of the substrate 21. For convenience of explanation, a case where the first and second slanting surfaces S1 and S2 are arranged on both edges of an identical shorter side surface from among the shorter side surfaces of the substrate 21 will now be described in detail.

The first and second slanting surfaces S1 and S2 may be arranged to face each other. The first slanting surface S1 and the second slanting surface S2 may be symmetrical to each other about an arbitrary straight line (or plane) that is parallel to the first surface 21-1 or the second surface 21-2 and passes through a center of the substrate 21. In this case, the first and second slanting surfaces S1 and S2 may have the same shapes. For example, an angle of the first slanting surface S1 with respect to the first surface 21-1 may be the same as angle as that of the second slanting surface S2 with respect to the second surface 21-2. A first distance W from an edge shared by the first slanting surface S1 and the first surface 21-1 to the shorter face Ed of the substrate 21 may be the same as a second distance from an edge shared by the second slanting surface S2 and the second surface 21-2 to the shorter face Ed of the substrate 21. The first distance W may be 5 μm or greater. In particular, when the first distance W is 5 μm or greater, fine cracks generated during removal of a portion of the substrate 21 may be removed, and, even when an external impact is applied to the first slanting surface S1, concentration of stress on the first slanting surface S1 may be prevented.

In this case, the first slanting surface S1 may extend from the first surface 21-1 in a direction toward the second surface 21-2 and may reach the shorter face Ed of the substrate 21. The edge shared by the first slanting surface S1 and the first surface 21-1 and an edge shared by the first slanting surface S1 and the shorter face Ed of the substrate 21 may be round such that stress is not concentrated on the two edges. The second slanting surface S2 may extend from the second surface 21-2 in a direction toward the first surface 21-1 and may reach the shorter face Ed of the substrate 21. The edge shared by the second slanting surface S2 and the second surface 21-2 and an edge shared by the second slanting surface S2 and the shorter face Ed of the substrate 21 may be round such that stress is not concentrated on the two edges.

The substrate 21 as described above may include a first area AR1 in which the protection unit 10 is arranged, and a second area AR2 in which few or no protection units 10 are arranged. In the first area AR1, the display unit D, the thin-film encapsulation layer E, and the protection unit 10 may be arranged. Because few or no protection units 10 are arranged in the second area AR2, the second area AR2 may be exposed. In this case, particles T may be arranged in the second area AR2. The particles T may include at least one of an adhesive 12, a protection film 11, cerium dioxide ($CeO_2$), diamond, silicon carbide (SiC), and an ionic component of a surfactant.

The thin film transistor TFT may be formed on the substrate 21, the passivation layer 27 may be formed to cover the thin film transistor TFT, and the OLED 28 may be formed on the passivation layer 27.

A buffer layer 22 formed of an organic compound or an inorganic compound is further formed on an upper surface of the substrate 21. The buffer layer 22 may be formed of silicon oxide ($SiO_x$) ($x \geq 1$) or silicon nitride ($SiN_x$) ($x \geq 1$), but is not limited as such.

An active layer 23 arranged in a predetermined pattern is formed on the buffer layer 22 and is then buried by a gate insulating layer 24. The active layer 23 includes a source region 23A and a drain region 23C and further includes a channel region 23B therebetween.

The active layer 23 may include various materials. For example, the active layer 23 may include an inorganic semiconductor material (such as amorphous silicon or crystalline silicon), an oxide semiconductor, an organic semiconductor material, or the like. However, for convenience of description, a case where the active layer 23 may be formed of amorphous silicon will now be described in detail.

The active layer 23 may be formed by forming an amorphous silicon layer on the buffer layer 22, crystallizing the amorphous silicon layer into a polycrystalline silicon layer, and patterning the polycrystalline silicon layer. The source region 23A and the drain region 23C of the active layer 23 are doped with impurities according to a TFT type, such as a driving TFT (not shown), a switching TFT, or the like.

A gate electrode 25 facing the active layer 23, and an interlayer insulating layer 26, which buries the gate electrode 25, are formed on an upper surface of the gate insulating layer 24.

Contact holes H1 are formed in an interlayer insulating layer 26 and the gate insulating layer 24, and then a source electrode 27A and a drain electrode 27B are formed on the interlayer insulating layer 26 such that the source electrode 27A and the drain electrode 27B contact the source region 23A and the drain region 23C, respectively.

The passivation layer 27 is formed on the thin film transistor TFT formed as described above, and a pixel electrode 28A of the OLED 28 is formed on the passivation layer 27. The pixel electrode 28A contacts the drain electrode 27B of the thin-film transistor TFT through a via hole H2 formed in the passivation layer 27. The passivation layer 27 may be formed of an inorganic material or an organic material as a single layer or multiple layers, but are not limited as such. The passivation layer 27 may be formed as a planarization layer such that an upper surface thereof is flat regardless of the unevenness of a lower layer under the passivation layer 27. Alternatively, the passivation layer 27 may be formed to be uneven according to the unevenness of the lower layer. The passivation layer 27 may be formed of a transparent insulator so a resonance effect is achieved.

After forming the pixel electrode 28A on the passivation layer 27, a pixel-defining layer 29 is formed of an organic material or an inorganic material such that the pixel-defining layer 29 covers the pixel electrode 28A and the passivation layer 27. The pixel-defining layer 29 has an aperture via which the pixel electrode 28A is exposed.

An intermediate layer 28B and an opposite electrode 28C are formed on at least the pixel electrode 28A. According to another embodiment, the opposite electrode 28C may be formed on the entire surface of the substrate 21. In this case, the opposite electrode 28C may be formed on the intermediate layer 28B and the pixel-defining layer 29. For convenience of description, a case where the opposite electrode 28C is formed on the intermediate layer 28B and the pixel-defining layer 29 will now be described in detail.

The pixel electrode 28A functions as an anode, and the opposite electrode 28C functions as a cathode. Alternatively, the pixel electrode 28A may function as a cathode, and the opposite electrode 28C may function as an anode.

The pixel electrode 28A and the opposite electrode 28C are insulated from each other by the intermediate layer 28B, and respectively apply voltages of opposite polarities to the intermediate layer 28B to induce light emission in an organic emission layer.

The intermediate layer 28B may include an organic emission layer. For example, the intermediate layer 28B includes an organic emission layer. However, the intermediate layer 28B may further include at least one of a hole injection layer (HIL), a hole transport layer (HTL), an electron transport layer (ETL), and an electron injection layer (EIL). The present embodiment is not limited thereto, and the intermediate layer 28B may further include various other functional layers (not shown) in addition to an organic emission layer.

A plurality of intermediate layers 28B as described above may be included, and the plurality of intermediate layers 28B may be formed in the display area DA. The plurality of intermediate layers 28B may be spaced apart from each other within the display area DA.

One unit pixel includes a plurality of sub-pixels, and the plurality of sub-pixels may emit light of various colors. For example, the unit pixel may include a plurality of sub-pixels which respectively emit red light, green light, and blue light, or a plurality of sub-pixels which respectively emit red light, green light, blue light, and white light.

Although not shown in the drawings, a capping layer (not shown) may be arranged on the opposite electrode 28C. The capping layer may have a lower refractive index than the opposite electrode 28C. This may improve luminescent efficiency by increasing a percentage that light generated by the intermediate layer 28B, including the organic emission layer which is reflected and emitted to the outside.

For example, the capping layer may include an organic material, such as poly(3,4-ethylenedioxythiophene) (or PEDOT), 4,4'-bis [N-(3-methylphenyl)-N-phenylamino] biphenyl (TPD), 4,4'0,4"-tris [(3-methylphenyl) phenylamino] triphenylamine (m-MTDATA), 1,3,5-tris [N,N-bis(2-methylphenyl)-amino]-benzene (o-MTDAB), 1,3,5-tris [N, N-bis (3-methylphenyl)-amino]-benzene (m-MTDAT), 1,3,5-tris [N,N-bis (4-methylphenyl)-amino]-benzene (p-MTDAB), 4,4'-bis [N, N-bis (3-methylphenyl)-amino]-diphenylmethane (BPPM), 4,4'-dicarbazolyl-1,1'-biphenyl (CBP), 4,4'0,4"-tris (N-carbazole) triphenylamine (TCTA), 2,2'0,2"-(1,3,5-benzenetolyl) tris-[1-phenyl-1H-benzoimidazole] (TPBI), and 3-(4-biphenyl)-4-phenyl-5-t-butylphenyl-1,2,4-triazole (TAZ), but are not limited as such.

Alternatively, the capping layer may include an inorganic material, such as zinc oxide, titanium oxide, zirconium oxide, silicon nitride, niobium oxide, tantalum oxide, tin oxide, nickel oxide, indium nitride, and gallium nitride. The materials of the capping layer are not limited thereto, and various other materials may be used.

A cover layer (not shown) may be arranged on the capping layer. The cover layer protects an OLED against damage that may occur during a subsequent process using plasma or the like. The cover layer may include lithium fluoride (LiF).

The thin-film encapsulation layer E may include a plurality of inorganic layers or include an inorganic layer and an organic layer.

The organic layer of the thin-film encapsulation layer E may include a polymer-based material. Examples of the polymer-based material may include acrylic resin, epoxy resin, polyimide, polyethylene, and the like.

For example, the organic layer may include polyethylene terephthalate, polyethylene naphthalate, polycarbonate, polyimide, polyethylene sulfonate, polyoxymethylene, polyarylate, hexamethyldisiloxane, acryl-based resin (e.g., polymethyl methacrylate or polyacryl acid), or any combination thereof.

The inorganic layer of the thin-film encapsulation layer E may include at least one inorganic insulating material, such as aluminum oxide, titanium oxide, tantalum oxide, hafnium oxide, zinc oxide, silicon oxide, silicon nitride, silicon oxynitride, and the like.

An uppermost layer exposed to the outside in the thin-film encapsulation layer E may include an inorganic layer to prevent infiltration of moisture to the OLED 28.

The thin-film encapsulation layer E may include at least one sandwich structure in which at least one organic layer is between at least two inorganic layers. Alternatively, the thin-film encapsulation layer E may include at least one sandwich structure in which at least one inorganic layer is between at least two organic layers. Alternatively, the thin-film encapsulation layer E may include a sandwich structure in which at least one organic layer is between at least two inorganic layers and a sandwich structure in which at least one inorganic layer is between at least two organic layers.

The thin-film encapsulation layer E may include a first inorganic layer, a first organic layer, and a second inorganic layer sequentially formed starting from an upper portion of the OLED 28.

Alternatively, the thin-film encapsulation layer E may include a first inorganic layer, a first organic layer, a second inorganic layer, a second organic layer, and a third inorganic layer sequentially formed starting from the upper portion of the OLED 28.

Alternatively, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 28.

The first organic layer may have a smaller area than the second inorganic layer, and the second organic layer may also have a smaller area than the third inorganic layer.

When a plurality of inorganic layers are included as described above, the plurality of inorganic layers may be deposited to directly contact each other at an edge region of the display unit D, and an organic layer may not be exposed.

The protection unit 10 may include the protection film 11 and the adhesive 12. The protection film 11 may include synthetic resin. The adhesive 12 may include an optically clear adhesive (OCR). According to another embodiment, the adhesive 12 may include polyurethane.

In this case, the protection unit 10 may shield the thin-film encapsulation layer E to protect the panel unit 20 from external impacts. Because the protection unit 10 is formed to have a larger area than a planar area of the thin-film encapsulation layer E, the protection unit 10 may completely shield the thin-film encapsulation layer E. The protection unit 10 may be attached to the panel unit 20 or detached from the panel unit 20, according to a selection.

Thus, the display panel 1 may prevent cracks or the like from being generated at its ends by external impacts.

Because fine cracks may be generated when the display panel 1 is processed are removed, damage to the display panel 1 due to the fine cracks may be prevented.

FIGS. 4 through 10 are cross-sectional views of a method of manufacturing the display panel 1, according to an embodiment.

Referring to FIGS. 4 through 10, a base member 2 may be prepared to manufacture the display panel 1. The base member 2 may be used as a single substrate 21 or may be cut and used as a plurality of substrates 21. For convenience of description, a case where the base member 2 is split and used as a plurality of substrates 21 will now be described in detail.

The base member 2 may be formed of the same material as the substrate 21. Before the display unit D is arranged on the base member 2, foreign materials may be removed via, for example, cleaning solution spraying or plasma processing.

A plurality of display units D may be arranged on the base member 2 to be spaced apart from each other. Each of the display units D is the same as the display unit D described above with reference to FIGS. 1 through 3, and thus a detailed description thereof is omitted herein.

After the plurality of display units D are formed on the base member 2, a thin-film encapsulation layer E may be formed to correspond to each of the plurality of display units D. The thin-film encapsulation layer E is the similar to the described above with reference to FIGS. 1 through 3, and thus a detailed description thereof is omitted herein.

Before the thin-film encapsulation layers E are formed on the display units D, a capping layer or the like may be formed between each of the thin-film encapsulation layers E and each of the display units D as described above with reference to FIGS. 1 through 3.

After the display units D and the thin-film encapsulation layers E are arranged on the base member 2 as described above, the protection unit 10 may be arranged on the thin-film encapsulation layers E. A plurality of protection units 10 may be included to shield as little as one area of the base member 2. According to another embodiment, one protection unit 10 may be included to shield the entire area of the base member 2. For convenience of description, a case where one protection unit 10 is included to shield the entire area of the base member 2 will now be described in detail.

Figure 8:
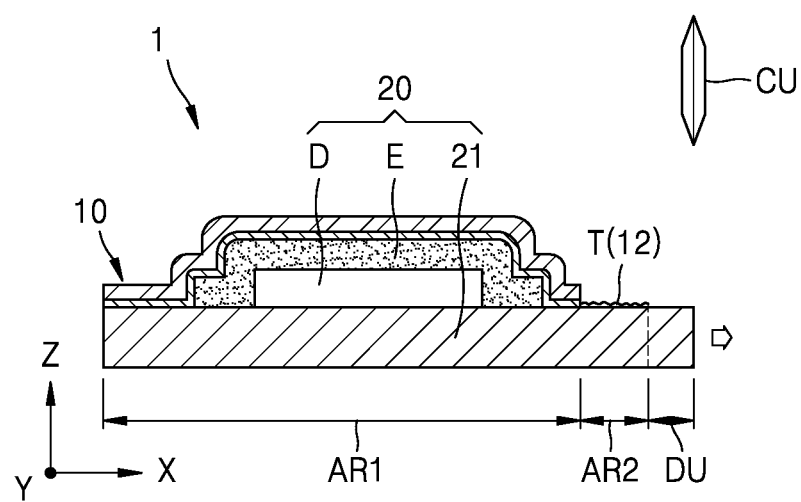

As illustrated in FIG. 8, after the protection unit 10 is arranged as described above, each of the protection unit 10 and the base member 2 may be cut into a plurality of portions. For example, after cracks or cutting grooves are formed in the protection unit 10 and the base member 2 by using a cutting unit CU, each of the protection unit 10 and the base member 2 may be cut into a plurality of portions. According to another embodiment, the base member 2 may be cut into a plurality of portions by completely removing a portion of the protection unit 10 and a portion of the base member 2 by using the cutting unit CU, and thus a plurality of substrates 21 may be formed. In this case, the base member 2 may be cut in one of a first direction or a second direction. The first direction may be a direction of one of a longer edge or shorter edge of a single display panel 1, and the second direction may be a direction of the other of the longer edge or shorter edge of the single display panel 1. The cutting unit CU may include a cutting wheel CU1 or a laser generator CU2. For convenience of description, a case where the cutting unit CU includes a cutting wheel will now be described in detail.

A portion of the protection unit 10 may be removed from a single display panel 1 manufactured by cutting the base member 2 into a plurality of portions. For example, a portion (not shown) of the protection unit 10 existing on a removal area AR3 of the substrate 21 may be removed. When a cutting line is formed on the protection unit 10 by using a cutting wheel, a knife, or the like, the portion of the protection unit 10 on the removal area AR3 may be removed based on the cutting line.

In this case, a portion of the protection unit 10 may remain in the removal area AR3. For example, a portion of the adhesive 12 or the protection film 11 included in the protection unit 10 may remain in the removal area AR3.

When a portion of the protection unit 10 is removed from the removal area AR3, a portion of the removal area AR3 may be removed. For example, the second area AR2 may be formed by removing a dummy area DU, which is a portion of an end of the removal area AR3, from the removal area AR3.

In detail, after a cutting groove or a cutting line, for example, is formed in the first surface 21-1 or the second surface 21-2 of the removal area AR3 like the base member 2 is cut into a plurality of portions, the cutting unit CU may cut the dummy area DU out of the substrate 21. In this case, the cutting unit CU may cut the dummy area DU out of the substrate 21 by completely cutting the substrate 21 in a thickness direction of the substrate 21, or by removing a portion of the substrate 21 in the thickness direction of the substrate 21 and then applying an impact to the dummy area DU. As described above, fine cracks may exist at the edges of the shorter face Ed of the substrate 21 from which the dummy area DU has been removed.

Figure 9:
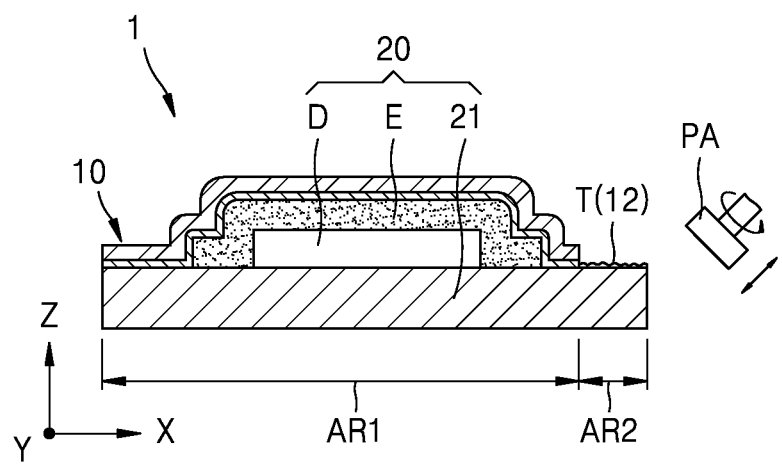

Thus, as shown in FIG. 9, the edges of the shorter face Ed of the second area AR2 may be ground by using a polishing pad PA. In this case, the polishing pad PA may have any of various shapes. For example, the polishing pad PA may include a soft polishing pad. The soft polishing pad may include cerium dioxide ($CeO_2$). As another example, the polishing pad PA may include a hard polishing pad. The hard polishing pad may include at least one of diamond and silicon carbide (SiC).

Figure 10:
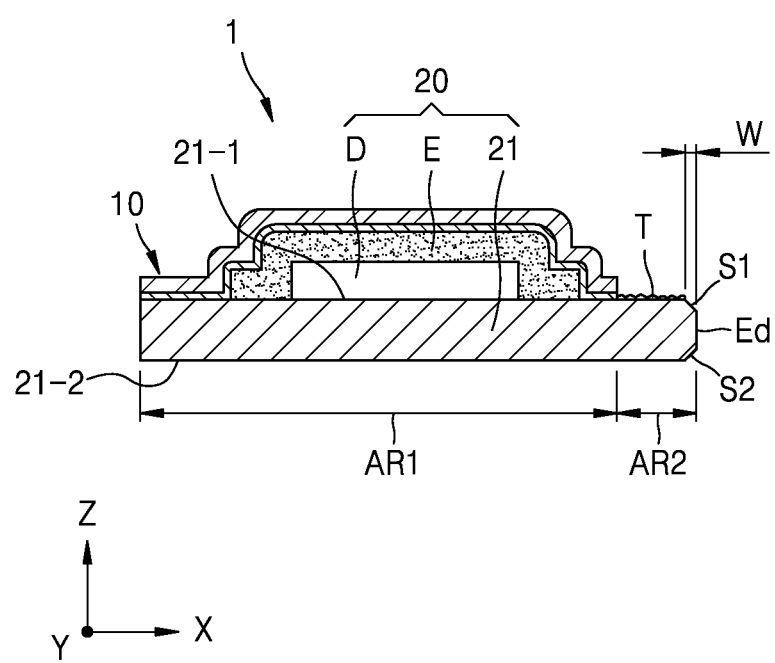
Figure 11:
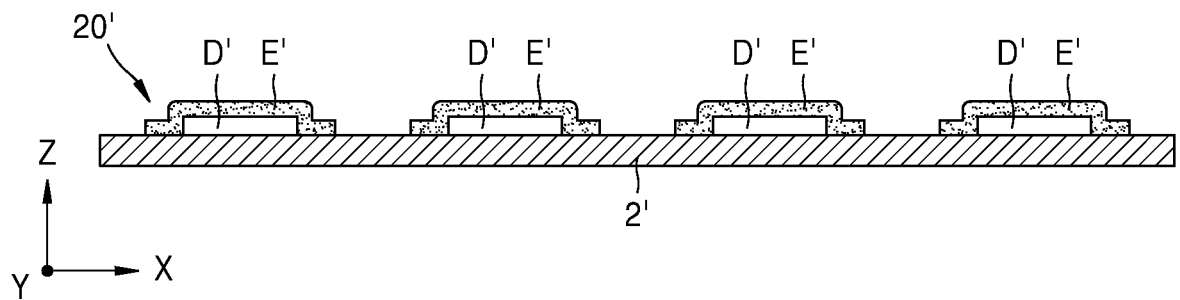
FIGS. 11 through 17 are cross-sectional views illustrating a method of manufacturing a display panel, according to another embodiment.
Figure 12:
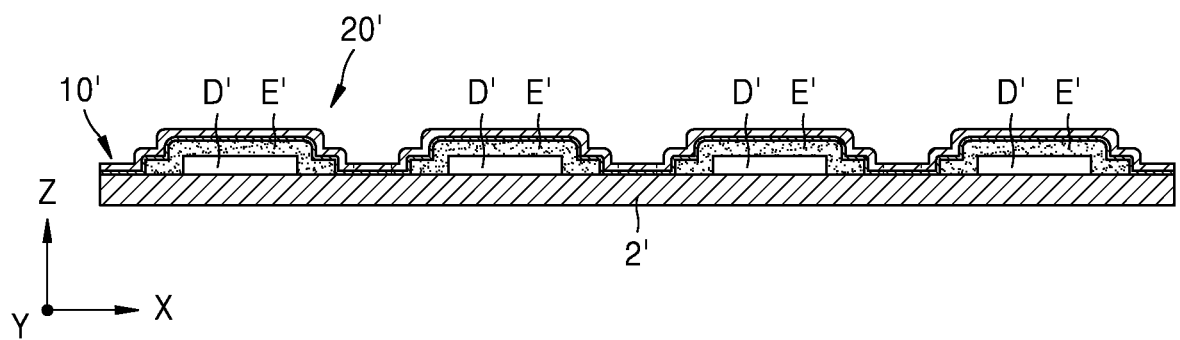
Figure 13:
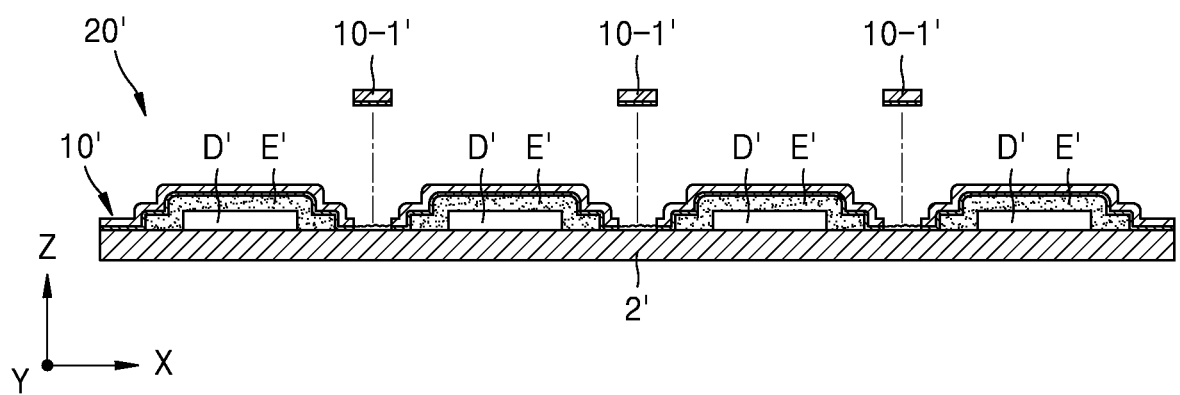
Figure 14:
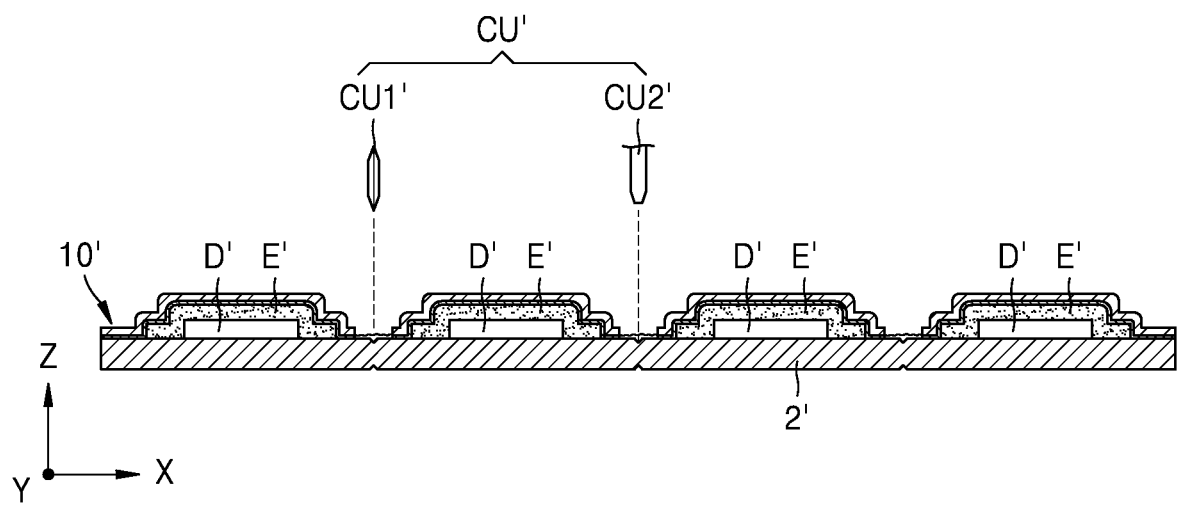

As a result, FIG. 10 shows the first slanting surface S1 and the second slanting surface S2 formed on the edges of the shorter face Ed in the second area AR2 by grinding the edges of the shorter face Ed by using the polishing pad PA as described above. For convenience of description, a case where both the first slanting surface S1 and the second slanting surface S2 are formed at the edges of the second area AR2 will now be described in detail. However, other variations may also be used. For example, in some embodiments, only one slanting surface is formed at one edge of the substrate 21-2.

The first and second slanting surfaces S1 and S2 may be sequentially or simultaneously formed. According to an embodiment, when the first slanting surface S1 and the second slanting surface S2 are sequentially formed, one of the first slanting surface S1 or the second slanting surface S2 may be formed, then the substrate 21 may be rotated upside down or the polishing pad PA may be linearly moved or rotated upside down, and then the other of the first slanting surface S1 and the second slanting surface S2 may be formed. According to another embodiment, when the first slanting surface S1 and the second slanting surface S2 are simultaneously formed, a plurality of polishing pads PA may be included, and the first slanting surface S1 and the second slanting surface S2 may be formed by using the plurality of polishing pads PA, respectively. For convenience of description, a case where one of the first slanting surface S1 and the second slanting surface S2 is formed and then the other is formed will now be described in detail.

When the first slanting surface S1 and the second slanting surface S2 are formed as described above and the polishing pad PA includes a soft polishing pad, the first slanting surface S1 and the second slanting surface S2 may include at least two layers. For example, reaction layers may be formed on the first slanting surface S1 and the second slanting surface S2 due to a chemical reaction that occurs between the polishing pad PA and the substrate 21 due to heat generated when the polishing pad PA operates. The substrate 21 may be arranged on lower surfaces of the reaction layers. On the other hand, when the polishing pad PA includes a hard polishing pad, the first slanting surface S1 and the second slanting surface S2 may be formed of the same material as the substrate 21.

When the polishing pad PA forms the first slanting surface S1 and the second slanting surface S2 as described above, a portion of the polishing pad PA may be seated on a portion of the first surface 21-1 in the second area AR2. At this time, when the polishing pad PA includes a soft polishing pad as described above, at least one of cerium dioxide, a reactant between the cerium dioxide and glass that is the same as the above-described reaction layers, the adhesive 12, and the protection film 11 may be arranged on at least a portion of the first surface 21-1 of the second area AR2. On the other hand, when the polishing pad PA includes a hard polishing pad, at least one of diamond, silicon carbide, the adhesive 12, and the protection film 11 may be arranged on at least the portion of the first surface 21-1 of the second area AR2. In particular, in this case, a component of the polishing pad PA may be separated from the polishing pad PA during formation of each slanting surface and may be absorbed into the second area AR2 by the adhesive 12 remaining on the first surface 21-1 of the second area AR2.

When the first slanting surface S1 and the second slanting surface S2 are formed as described above, fine cracks generated at the shorter face Ed of the substrate 21 during removal of the dummy area DU may be removed. When the dummy area DU is removed, the fine cracks may be concentrated on a portion where the substrate 21 and the dummy area DU are initially separated.

However, when the first slanting surface S1 and the second slanting surface S2 are formed on the substrate 21 as described above, a portion of the substrate 21 including this fine crack may be removed, and thus, when an external impact is applied the substrate 21, damage to the substrate 21 may be prevented. When the display panel 1 falls, even when it falls on the edge of the shorter face Ed of the substrate 21, an area of contact between the edge and the ground may be increased, and pressure may be efficiently dispersed.

In this case, as described above with reference to FIGS. 1 through 3, a distance from an edge of one surface of the substrate 21, where each of the first slanting surface S1 or the second slanting surface S2 starts to an end surface of the substrate 21, may be 5 μm to 200 μm.

When the first slanting surface S1 and the second slanting surface S2 are formed using the polishing pad PA as described above, particles T may accumulate on the first surface 21-1 of the second area AR2, and thus a thickness of the second area AR2 may be slightly greater than that of the other portion of the substrate 21. In this case, the strength of the second area AR2 is reinforced, and thus, even when an external force is applied to the second area AR2, the second area AR2 may not be damaged to thereby prevent damage to the substrate 21.

Thus, in the method of manufacturing the display panel 1, a portion of the display panel 1, on which stress may be concentrated, is removed, and fine cracks generated during the manufacture of the display panel 1 are also completely removed, and thus damage to the display panel 1 due to an external force or the like applied to an end of the substrate 21 may be prevented.

Moreover, in the method of manufacturing the display panel 1, the display panel 1 having an improved strength may be manufactured, and a failure rate after the display panel 1 is manufactured, may be minimized.

FIGS. 11 through 17 are cross-sectional views illustrating a method of manufacturing a display panel 1', according to another embodiment.

Referring to FIGS. 11 through 17, the display panel 1' may be manufactured via a base member 2'.

In detail, a plurality of display units D' may be arranged on the base member 2' to be spaced apart from each other. A description of each of the plurality of display units D' may be the same as that of the display unit D given with reference to FIGS. 1 through 3. A thin-film encapsulation layer E' may be arranged on each of the plurality of display units D'. The plurality of thin-film encapsulation layers E' may be spaced apart from each other to correspond to the plurality of display units D', respectively. According to another embodiment, a single thin-film encapsulation layer E' may be formed on the entire surface of the base member 2'. According to another embodiment, a single thin-film encapsulation layer E' may be formed on the entire surface of the base member 2' and then portions of the thin-film encapsulation layer E' between adjacent display units D' may be removed, and thus thin-film encapsulation layers E' respectively on the display units D' may be arranged apart from each other. For convenience of description, a case where thin-film encapsulation layers E' are arranged apart from each other will now be described in detail.

After the display units D' and the thin-film encapsulation layers E' are formed on the base member 2' as described above, a protection unit 10' may be arranged on the thin-film encapsulation layers E'. According to an embodiment, a protection unit 10' may be arranged to shield the entire surface of the base member 2'. According to another embodiment, a plurality of protection units 10' may be arranged to correspond to the plurality of display units D', respectively, and be spaced apart from each other. For convenience of description, a case where a single protection unit 10' is arranged on the entire surface of the base member 2' will now be described in detail.

When the protection unit 10' is arranged on the entire surface of the base member 2' as described above, a portion of the protection unit 10' may be removed to expose the base member 2'. At this time, portions of the protection unit 10' between adjacent display units D' may be removed in a first direction or a second direction. The first direction may be one of an X direction and a Y direction of FIG. 10, and the second direction may be the other of the X direction and the Y direction of FIG. 10.

When a portion of the protection unit 10' is removed as described above, a removal area AR3' may be exposed. A cutting line or a cutting groove may be formed by spraying an etchant onto the removal area AR3', by radiating laser to the removal area AR3', or by using a knife or the like.

Figure 15:
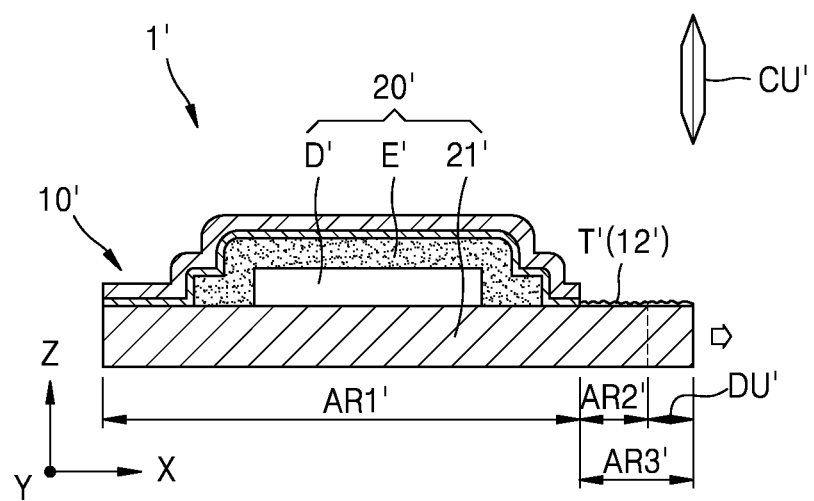

Thereafter, as shown in FIG. 15, a cutting unit CU' may be arranged to correspond to the cutting line or the cutting groove, and then the base member 2' may be cut into a plurality of portions by completely cutting the base member 2' in a thickness direction of the base member 2' by using the cutting unit CU' or by cutting a portion of the base member 2' and applying a force. In this case, each of a plurality of base members 2', obtained by the cutting, may form a single substrate 21'.

Thereafter, a cutting line or a cutting groove is formed in the removal area AR3' of the single substrate 21' in the same method as or a similar method to the method described above, and then a dummy area DU' may be removed via the cutting unit CU'.

When the dummy area DU' is removed as described above, fine cracks may remain at edges in the second area AR2' connected to the first area AR1'. To remove these fine cracks, a first slanting surface S1' or a second slanting surface S2' may be formed using a polishing pad PA'.

Figure 16:
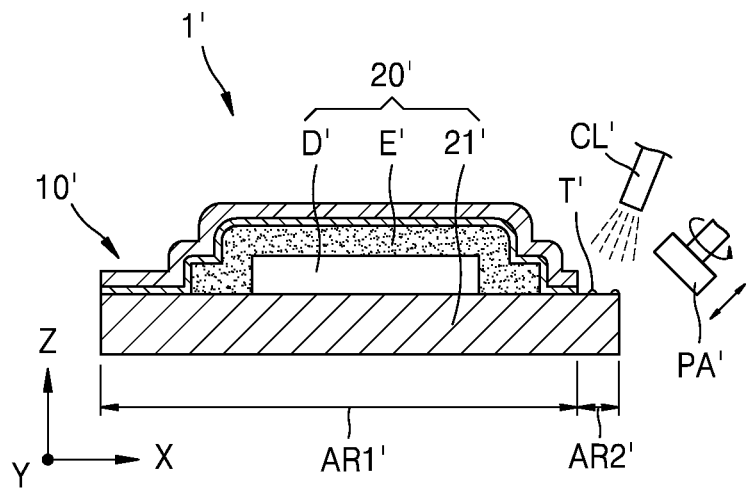
Figure 17:
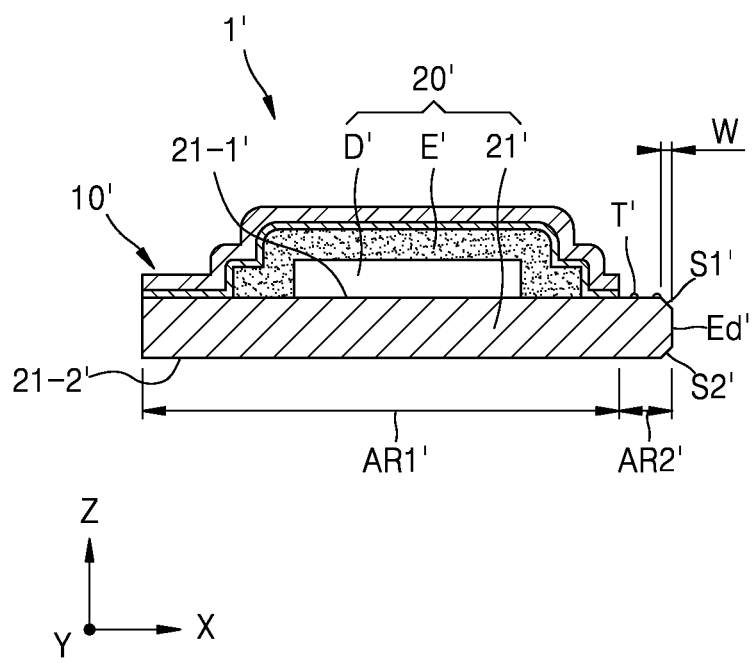

As shown in FIG. 16, during or after the forming of the first slanting surface S1' or the forming of the second slanting surface S2' using the polishing pad PA' as described above, the first surface 21-1' of the second area AR2' may be cleaned using a cleaning unit CL'. For convenience of description, a case where, while the first slanting surface S1' or the second slanting surface S2' are being formed, the cleaning unit CL' cleans the first surface 21-1' will now be described in detail. In particular, a case where the cleaning unit CL' cleans the first surface 21-1' of the second area AR2' will be focused on and described below.

In this case, according to an embodiment, the cleaning unit CL' may spray a surfactant to the first surface 21-1' of the second area AR2'. According to another embodiment, the cleaning unit CL' may spray oxygen plasma to the first surface 21-1' of the second area AR2'. For convenience of description, a case where the cleaning unit CL' sprays a surfactant to the first surface 21-1' of the second area AR2' will now be described in detail.

When a surfactant is sprayed to the first surface 21-1' of the second area AR2' as described above, at least a portion of at least one of a component of the polishing pad PA', an adhesive 12', and a protection film 11' arranged on the first surface 21-1' of the second area AR2' may be cleaned and removed. A portion of the surfactant may remain on the first surface 21-1' of the second area AR2'. In this case, an ionic component of the surfactant may remain on the first surface 21-1' of the second area AR2'.

In this case, at least one of the adhesive 12', cerium dioxide ($CeO_2$), diamond, silicon carbide (SiC), and the ionic component of the surfactant may be arranged on the first surface 21-1' of the second area AR2'.

When this process is completed, the manufactured display panel 1' may be carried out to the outside or may be supplied to another apparatus.

Thus, in the method of manufacturing display panel 1', a portion of the display panel 1' is removed where stress may be concentrated. Fine cracks generated during the manufacture of the display panel 1' are also completely removed. The removal of the fine cracks may prevent damage to the display panel 1' due to an external force or the like applied to an end of the substrate 21'.

Moreover, the method of manufacturing the display panel 1' may result in the display panel 1' having improved strength characteristics, and a failure rate after the display panel 1' is manufactured may be minimized.

Display panels according to embodiments may be prevented from being damaged by external impacts by preventing the generation of cracks. In a method of manufacturing a display panel, according to the inventive concept, a display panel having improved strength characteristics may be manufactured. Moreover, in the method of manufacturing a display panel, according to the inventive concept, generation of a failure during the manufacture of the display panel may be minimized.

While the inventive concept has been particularly shown and described with reference to exemplary embodiments thereof, it will be understood by those of ordinary skill in the art that various changes in form and details may be made therein without departing from the spirit and scope as defined by the following claims.

In the present disclosure, the term "or" should be interpreted to mean an inclusive or. That is, "A or B" means either A, B, or both A and B.

What is claimed is:

1. A method of manufacturing a display panel, the method comprising:
   manufacturing a display panel comprising a substrate having a first surface and a second surface, a display unit arranged on the first surface of the substrate and comprising an organic light-emitting diode, and a thin-film encapsulation layer configured to shield the display unit;
   removing a portion of the substrate on which the thin-film encapsulation layer is not arranged; and forming a slanting surface inclined with respect to the first surface or the second surface by grinding an edge of the first surface or an edge of the second surface from which the portion of the substrate has been removed.

2. The method of claim 1, further comprising arranging a protection unit on the thin-film encapsulation layer.

3. The method of claim 2, further comprising removing a portion of the protection unit.

4. The method of claim 2, wherein the protection unit comprises:
an adhesive arranged on the thin-film encapsulation layer; and
a protection film arranged on the adhesive.

5. The method of claim 1, wherein the edge of the first surface or the edge of the second surface are ground using a soft pad or a hard pad.

6. The method of claim 1, wherein a distance from a starting point of the slanting surface of the first surface or the slanting surface of the second surface to an end of the substrate is 5 µm or greater.

7. A method of manufacturing a display panel, the method comprising:
manufacturing a display panel comprising a substrate having a first surface and a second surface, a display unit arranged on the first surface of the substrate and comprising an organic light-emitting diode, and a thin-film encapsulation layer configured to shield the display unit;
arranging a protection unit on the thin-film encapsulation layer;
removing a portion of the protection unit on which the thin-film encapsulation layer is not arranged;
dividing the substrate into a first area where the protection unit shields the first substrate and a second area that does not overlap the first area, by removing a portion of the substrate from which the portion of the protection unit has been removed; and
forming a slanting surface inclined with respect to the first surface or the second surface by grinding an edge of the first surface or an edge of the second surface from which the portion of the substrate has been removed.

8. The method of claim 7, further comprising removing foreign materials on the second area.

9. The method of claim 8, wherein the foreign materials on the second area are cleaned and removed by using a surfactant.

10. The method of claim 7, wherein foreign materials on the second area are processed with oxygen plasma and removed.

11. The method of claim 7, wherein at least one of an adhesive, cerium dioxide ($CeO_2$), diamond, silicon carbide (SiC), and an ionic component of a surfactant is arranged on the second area.

12. The method of claim 7, wherein a distance from a starting point of the inclined corner of the first surface or the inclined corner of the second surface to an end of the substrate is 5 µm or greater.

13. The method of claim 7, wherein the protection unit comprises:
an adhesive arranged on the thin-film encapsulation layer; and
a protection film arranged on the adhesive.

14. The method of claim 13, wherein the adhesive comprises polyurethane.

15. The method of claim 7, wherein the edge of the first surface or the edge of the second surface are ground using a soft pad or a hard pad.

* * * * *